(12) United States Patent
Fuchida et al.

(10) Patent No.: US 10,855,054 B2
(45) Date of Patent: Dec. 1, 2020

(54) SEMICONDUCTOR LASER DEVICE AND METHOD FOR MANUFACTURING SEMICONDUCTOR LASER DEVICE

(71) Applicant: Mitsubishi Electric Corporation, Tokyo (JP)

(72) Inventors: Ayumi Fuchida, Tokyo (JP); Yuichiro Okunuki, Tokyo (JP); Go Sakaino, Tokyo (JP); Tetsuya Uetsuji, Tokyo (JP); Naoki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/462,505

(22) PCT Filed: Jan. 19, 2017

(86) PCT No.: PCT/JP2017/001769
§ 371 (c)(1),
(2) Date: May 20, 2019

(87) PCT Pub. No.: WO2018/134950
PCT Pub. Date: Jul. 26, 2018

(65) Prior Publication Data
US 2019/0334317 A1  Oct. 31, 2019

(51) Int. Cl.
*H01S 5/12* (2006.01)
*H01S 5/10* (2006.01)

(52) U.S. Cl.
CPC .......... *H01S 5/1203* (2013.01); *H01S 5/1082* (2013.01); *H01S 5/1234* (2013.01)

(58) Field of Classification Search
CPC .......... H01S 5/12–1246; H01S 5/0287; H01S 5/1039; H01S 5/1082–1085;
(Continued)

(56) References Cited

U.S. PATENT DOCUMENTS 4,506,367 A * 3/1985 Akiba .................. H01S 5/12
                                                372/45.01
4,835,788 A * 5/1989 Yamaguchi ............ H01S 5/164
                                                372/46.01
(Continued)

FOREIGN PATENT DOCUMENTS

CN  106170898 A      11/2016
JP  58105586 A  *   6/1983  ............. H01S 5/227
(Continued)

OTHER PUBLICATIONS

International Search Report; Written Opinion; and Notification of Transmittal of the International Search Report and the Written Opinion of the International Searching Authority, or the Declaration issued in PCT/JP2017/001769; dated Mar. 28, 2017.
(Continued)

*Primary Examiner* — Joshua King
(74) *Attorney, Agent, or Firm* — Studebaker & Brackett PC

(57) ABSTRACT

A semiconductor laser device includes a semiconductor substrate, a resonator unit formed on the semiconductor substrate and having an active layer, a diffraction grating formed on or underneath the active layer, a front facet of an inverted mesa slope, and a rear facet, an anti-reflection coating film formed on the front facet, a reflective film formed on the rear facet, an upper electrode formed on the resonator unit, and a lower electrode formed underneath the semiconductor substrate, wherein a length in a resonator direction of the resonator unit is shorter than a length in the resonator direction of the semiconductor substrate, and a laser beam is emitted from the front facet.

11 Claims, 6 Drawing Sheets

(58) Field of Classification Search
CPC . H01S 5/16–168; H01S 5/302–320275; H01S 5/2201; H01S 5/2213–2216

See application file for complete search history.

(56) References Cited

U.S. PATENT DOCUMENTS

| | | | | |
|---|---|---|---|---|
| 5,237,639 | A * | 8/1993 | Kato | G02B 6/131 |
| | | | | 257/E27.12 |
| 5,250,462 | A * | 10/1993 | Sasaki | H01S 3/1055 |
| | | | | 438/24 |
| 5,608,749 | A * | 3/1997 | Kizuki | H01S 5/0201 |
| | | | | 372/36 |
| 2003/0063643 | A1* | 4/2003 | Yoshida | H01S 3/13013 |
| | | | | 372/45.01 |
| 2004/0066817 | A1* | 4/2004 | Ungar | H01S 5/18 |
| | | | | 372/45.01 |
| 2006/0166386 | A1* | 7/2006 | Yamada | H01S 5/16 |
| | | | | 438/22 |
| 2008/0175549 | A1* | 7/2008 | Uetake | B82Y 20/00 |
| | | | | 385/131 |
| 2009/0129421 | A1 | 5/2009 | Kitatani et al. | |
| 2010/0091811 | A1* | 4/2010 | Behfar | G11B 7/127 |
| | | | | 372/50.23 |
| 2010/0284435 | A1* | 11/2010 | Achtenhagen | H01S 5/125 |
| | | | | 372/50.1 |
| 2013/0010824 | A1* | 1/2013 | Okumura | B82Y 20/00 |
| | | | | 372/45.01 |
| 2013/0177037 | A1* | 7/2013 | Yagi | H01S 5/3013 |
| | | | | 372/50.1 |
| 2013/0183784 | A1* | 7/2013 | Katsuyama | B82Y 20/00 |
| | | | | 438/47 |
| 2013/0287054 | A1* | 10/2013 | Kwon | H01S 5/1225 |
| | | | | 372/45.01 |
| 2015/0124846 | A1 | 5/2015 | Behfar et al. | |
| 2017/0371110 | A1* | 12/2017 | Cheng | G02B 6/4246 |
| 2018/0081118 | A1* | 3/2018 | Klamkin | G02B 6/1228 |
| 2018/0166859 | A1* | 6/2018 | Hashimoto | H01S 5/3401 |
| 2018/0294620 | A1* | 10/2018 | Suzuki | H01S 5/0261 |

FOREIGN PATENT DOCUMENTS

| | | | | |
|---|---|---|---|---|
| JP | 60066491 | A * | 4/1985 | H01S 5/12 |
| JP | 61253881 | A * | 11/1986 | H01S 5/1082 |
| JP | 01090582 | A * | 4/1989 | H01S 5/1082 |
| JP | 2009-130030 | A | 6/2009 | |
| JP | 2011-119311 | A | 6/2011 | |

OTHER PUBLICATIONS

N. Nakamura et al.; "25.8Gbps Direct Modulation AlGaInAs DFB Lasers of Low Power Consumption and Wide Temperature Range Operation for Data Center"; Optical Fiber Communication Conference 2015; paper W2A.53.pdf; Mar. 2015.

Shinji Matsuo et al.; "Directly Modulated DFB Laser on SiO2/Si Substrate for Datacenter Networks"; Journal of Lightwave Technology; Mar. 2015; p. 1217-1222; vol. 33, No. 6.

An Office Action issued by the State Intellectual Property Office of the People's Republic of China dated Jun. 3, 2020, which corresponds to Chinese Patent Application No. CN 201780083335.6.

* cited by examiner

SEMICONDUCTOR LASER DEVICE AND METHOD FOR MANUFACTURING SEMICONDUCTOR LASER DEVICE

FIELD

The present invention relates to a semiconductor laser device and a manufacturing method of a semiconductor laser device.

BACKGROUND

A semiconductor laser device that emits light from a facet of a waveguide is called an edge-emitting semiconductor laser. The edge-emitting semiconductor laser has a waveguide structure in which an active layer is sandwiched between upper and lower cladding layers. One of the cladding layers is n-type doped while the other is p-type doped. Holes are injected from the p-type cladding layer into the active layer, electrons are injected from the n-type cladding layer into the active layer, and the holes and the electrons recombine in the active layer and light is thereby emitted. The light obtains gain and is amplified while propagating through the waveguide.

In a distributed feedback laser diode (DFB-LD), which is one of edge-emitting semiconductor lasers, a resonator is formed by a reflecting mirror consisting of an interface between a facet of a semiconductor laser device and air as an emitting medium, and a diffraction grating. Part of the light propagating in the waveguide is emitted to the outside at the semiconductor facet, resulting in mirror loss. The remaining light is reflected by the facet and propagates in the waveguide again. While these are repeated, only a specific wavelength having a stationary wave resonates in the resonator. Laser oscillation occurs when the sum of the internal loss at the propagation in the waveguide and the mirror loss at the time of reflection at the facet becomes equal to the gain obtained during the propagation, and coherent light is emitted from the facet.

In order to high-speed modulate the DFB-LD, high relaxation oscillation frequency fr is needed. If $\Gamma$ represents optical confinement factor, vg represents group velocity, q represents elementary electric charge, L represents active layer length, W represents active layer width, d represents active layer thickness, $$\frac{dg}{dN}$$

represents differential gain, $\eta_1$ represents internal quantum efficiency, I represents current value, and Ith represents threshold current, then the following mathematical expression 1 is established. From the mathematical expression 1, it will be appreciated that the length of the active layer L, i.e., the resonator length of the laser device needs to be shortened in order to increase fr.

[Math. 1]

$$f_r \propto \sqrt{\frac{\Gamma v_g}{qLWd}\frac{dg}{dN}\eta_i(I - I_{th})}$$ Expression 1

If the resonator length of the laser device is shortened in this manner, the fr is increased but, if the resonator length is shortened, a problems arises that chip handling, cleavage, and the like become difficult. Various techniques disclosed, for example, in PTLs 1 and 2 and NPLs 1 and 2 have been proposed. Specifically, as a scheme for shortening the resonator length while maintaining the chip size, integration of transparent waveguide, emitting facet forming technique by dry etching, a laser device with effective resonator length shortened by performing current injection only on a part of the active layer, and the like have been proposed. Also, as a prior art example, a horizontal resonator type surface emitting laser device has been proposed in which a crystal plane made of a (111) plane is used as a reflecting mirror and light is emitted toward the chip surface or in a substrate direction.

PRIOR ART

Patent Literature

Patent Literature 1: JP 2011-119311 A
Patent Literature 2: JP 2009-130030 A

Non Patent Literature

Non Patent Literature 1: N. Nakamura et. al., Optical Fiber Communication Conference 2015
Non Patent Literature 2: S. Matsuo et. al., J. Lightwave Technol. 33, No. 6, 2015

SUMMARY

Technical Problem

Several methods have been proposed as described above in order to realize a semiconductor laser device capable of high speed operation and having a shortened resonator length. These proposals are roughly divided into a pattern in which the chip size is reduced and a pattern in which a transparent waveguide is integrated on the outside. The former, as described above, has a handling problem in an assembly process and the like and a problem that cleavage becomes difficult. In the latter, for example, when integration of the transparent waveguide is performed, the number of times of crystal growth increases and a problem arises that the cost increases.

The present invention has been made to solve the above-mentioned problems, and it is an object of the present invention to provide a semiconductor laser device and a manufacturing method of a semiconductor laser device which can facilitate handling and cleavage and shorten the length of the resonator unit.

Means for Solving the Problems

A semiconductor laser device according to this invention includes a semiconductor substrate, a resonator unit formed on the semiconductor substrate and having an active layer, a diffraction grating formed on or underneath the active layer, a front facet of an inverted mesa slope, and a rear facet, an anti-reflection coating film formed on the front facet, a reflective film formed on the rear facet, an upper electrode formed on the resonator unit, and a lower electrode formed underneath the semiconductor substrate, wherein a length in a resonator direction of the resonator unit is shorter than a length in the resonator direction of the semiconductor substrate, and a laser beam is emitted from the front facet.

A semiconductor laser device according to another aspect of this invention includes a semiconductor substrate, a resonator unit formed on the semiconductor substrate and having an active layer, a diffraction grating formed on or underneath the active layer, a front facet of a forward mesa slope, and a rear facet, wherein a length in a resonator direction is shorter than a length in the resonator direction of the semiconductor substrate, an anti-reflection coating film formed on the front facet, a reflective film formed on the rear facet, a metal mirror provided on the semiconductor substrate, an upper electrode formed on the resonator unit, and a lower electrode formed underneath the semiconductor substrate, wherein a laser beam emitted from the front facet is reflected by the metal mirror.

A manufacturing method of a semiconductor laser device according to this invention characterized by the fact that it includes the steps of forming a mask on a semiconductor substrate, selectively growing a semiconductor layer on a portion of the semiconductor substrate not covered with the mask and forming a resonator unit having a front facet defining a slope, forming an upper electrode on an upper surface of the resonator unit and forming a lower electrode on a lower surface of the semiconductor substrate, and forming an anti-reflection coating film on the front facet and forming a reflective film on a rear facet of the resonator unit, wherein a length in a resonator direction of the resonator unit is shorter than a length in the resonator direction of the semiconductor substrate.

A manufacturing method of a semiconductor laser device according to another aspect of this invention characterized by the fact that it includes the steps of growing a semiconductor layer on a semiconductor substrate to form a resonator unit, forming a mask on a part of the resonator unit, performing anisotropic etching with etchant on a portion of the resonator unit not covered with the mask and shaping a front facet of the resonator unit into a slope, forming an upper electrode on an upper surface of the resonator unit and forming a lower electrode on a lower surface of the semiconductor substrate, and forming an anti-reflection coating film on the front facet and forming a reflective film on a rear facet of the resonator unit, wherein a length in a resonator direction of the resonator unit is shorter than a length in the resonator direction of the semiconductor substrate.

Other features will be disclosed below.

Advantageous Effects of Invention

According to this invention, since the resonator length of the resonator unit is shortened while the length of the semiconductor substrate is maintained, handling and cleavage are facilitated.

DESCRIPTION OF EMBODIMENTS

Figure 1:
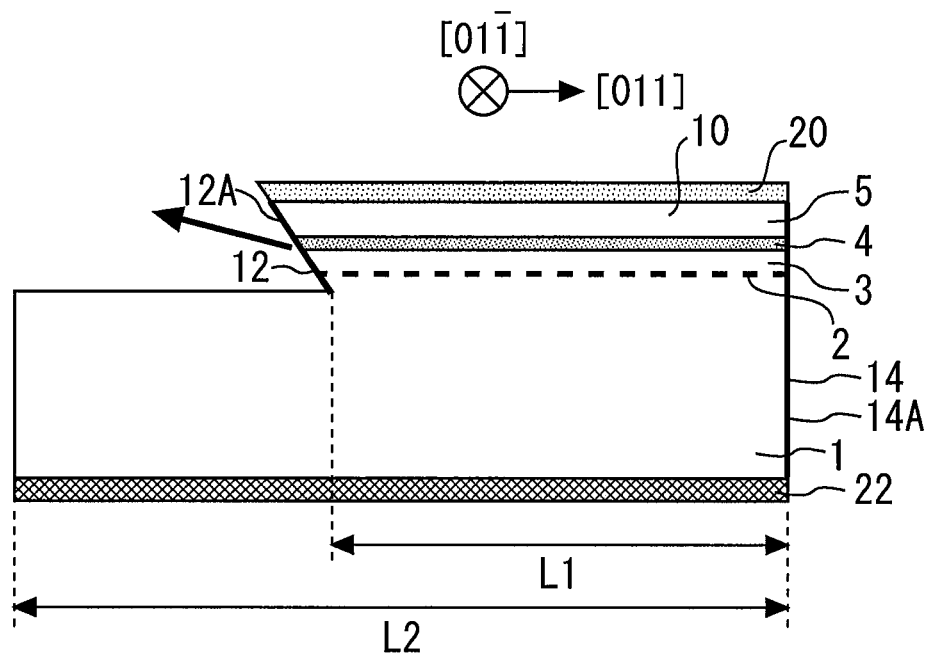
FIG. 1 is a cross-sectional view of a semiconductor laser device according to Embodiment 1.

A semiconductor laser device and a manufacturing method of a semiconductor laser device according to embodiments of the present invention are described with reference to the drawings. The same or corresponding constituent elements are denoted by the same reference numerals, and repeated explanations thereof may be omitted.

Embodiment 1

FIG. 1 is a cross-sectional view of a semiconductor laser device according to Embodiment 1 of the present invention. This semiconductor laser device includes a semiconductor substrate 1. The semiconductor substrate 1 is a substrate having as its main surface a p-type or n-type doped (100) surface. The material of the semiconductor substrate 1 is, for example, InP. A substrate formed by InP and a layer formed thereon may be provided as the semiconductor substrate 1. That is, the semiconductor substrate 1 may be configured by one substrate but the substrate and a layer formed thereon may be collectively provided as the semiconductor substrate 1.

On the main surface of the semiconductor substrate 1, a resonator unit 10 is formed. The resonator unit 10 includes a first cladding layer 3, a diffraction grating 2 formed in the first cladding layer 3, an active layer 4 formed on the first cladding layer 3, a second cladding layer 5 formed on the active layer 4, a front facet 12 of an inverted mesa slope, and a rear facet 14. The first cladding layer 3 is formed, for example, by InP. The diffraction grating 2 is formed, for example, by an InGaAsP-based semiconductor. The diffraction grating 2 may be formed on the active layer 4 and may be formed underneath the active layer 4. For example, the diffraction grating 2 may be formed on the second cladding layer 5. The active layer 4 is formed, for example, by an AlGaInAs-based or InGaAsP-based semiconductor. The active layer 4 may include a quantum well structure.

The second cladding layer 5 is formed, for example, by InP. If the semiconductor substrate 1 is p-type doped, the first cladding layer 3 is p-type doped and, and the second cladding layer 5 is n-type doped. Meanwhile, if the semiconductor substrate 1 is n-type doped, the first cladding layer 3 is n-type doped and the second cladding layer 5 is p-type doped.

As described above, the front facet 12 defines an inverted mesa slope. Inverted mesa refers to mesa whose width is reduced at its lower portion and increased at its upper portion. Accordingly, an inverted mesa slope is a slope whose upper portion protrudes more outwardly than the lower portion thereof. The front facet 12 according to Embodiment 1 is a downward (111) B surface. This front facet 12 is a surface having an inclination of 54.7° with respect to the (100) surface which is the main surface of the semiconductor substrate 1. To put it another way, the angle defined by the front facet 12 and the main surface of the semiconductor substrate 1 is 54.7°. The rear facet 14 is a surface parallel to the (011) surface. The rear facet 14 is a cleaved surface formed by cleavage.

On the front facet 12, an anti-reflection coating film 12A is formed. The material of the anti-reflection coating film 12A is, for example, at least one of Si, $SiO_2$, $Al_2O_3$, $Ta_2O_5$, and SiN. The anti-reflection coating film 12A may be of a single layer or a multiple layers. On the rear facet 14, a reflective film 14A is formed. The reflective film 14A may be called high reflectance coating film. The material of the reflective film 14A is, for example, at least one of Si, $SiO_2$, $Al_2O_3$, $Ta_2O_5$, and SiN. The reflective film 14A may be of a single layer or multiple layers. By adjusting the film thickness of the anti-reflection coating film 12A and the reflective film 14A, a predetermined reflectance is realized.

On the resonator unit 10, an upper electrode 20 is formed. Underneath the semiconductor substrate 1, a lower electrode 22 is formed. The material of the upper electrode 20 and the lower electrode 22 may be provided, for example, as metal such as Au, Ge, Zn, Pt, Ti, etc. By applying voltage to the upper electrode 20 and the lower electrode 22, a current flows in the semiconductor laser device and the current is injected into the active layer 4 to obtain light emission from the active layer 4.

FIG. 1 illustrates the length L1 of the resonator unit 10 in a resonator direction. The resonator direction is a direction that is parallel to the direction from the front facet 12 toward the rear facet 14. The resonator direction in this embodiment is a [011] direction. Accordingly, the length of the resonator unit 10 in the resonator direction is a length from the front facet 12 to the rear facet 14. FIG. 1 also illustrates the length L2 of the semiconductor substrate 1 in the resonator direction. The length L1 of the resonator unit 10 in the resonator direction is defined to be shorter than the length L2 of the semiconductor substrate 1 in the resonator direction. That is, L1<L2. In the semiconductor laser device according to Embodiment 1 of the present invention which is a DFB laser device for high-speed modulation. The L1 is, for example, 50 to 200 µm and the L2 is, for example, 200 to 400 µm.

The semiconductor laser device according to Embodiment 1 is configured to emit a laser beam from the front facet 12. The arrow extending from the front facet 12 of FIG. 1 indicates an emission direction of the laser beam. Since the anti-reflection coating film 12A is formed on the front facet 12, the light laser-oscillated by the resonator unit 10 is emitted on an as-is basis from front facet 12 to the outside. The angle defined by the front facet 12 and the main surface of the semiconductor substrate 1 is 54.7°, a refractive index of the semiconductor of the resonator unit 10 is in the order of 3.2, and a refractive index of outside air is in the order of 1, so that the laser beam is emitted obliquely upward from the front facet 12. Since the laser beam is emitted obliquely upward from the front facet 12, the laser beam is never blocked by the semiconductor substrate 1. In other words, mechanical vignetting due to the semiconductor substrate 1 does not exist.

Figure 2:
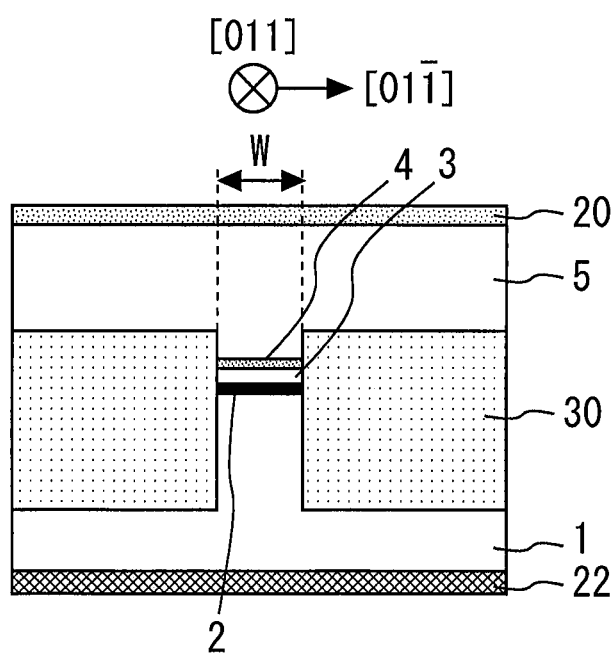
FIG. 2 is a cross-sectional view of a semiconductor laser device according to Embodiment 1.

FIG. 2 is a cross-sectional view of the semiconductor laser device taken along the plane perpendicular to the resonator direction. The active layer 4 is embedded by an embedding structure 30. The embedding structure 30 is, for example, a semi-insulating material layer such as InP doped with Fe or Ru. By providing the embedding structure 30 on the left and right sides of the active layer 4, current constriction is performed such that the current is efficiently injected into the active layer 4. The width W of the active layer 4 is, for example, 0.8 to 1.6 µm. In place of the embedding structure 30, structures such as a current block embedding layer using thyristor structure consisting of p-type InP and n-type InP or a ridge laser in which embedding by semiconductor is not performed may be adopted.

(On the Manufacturing Method)

Figure 3:
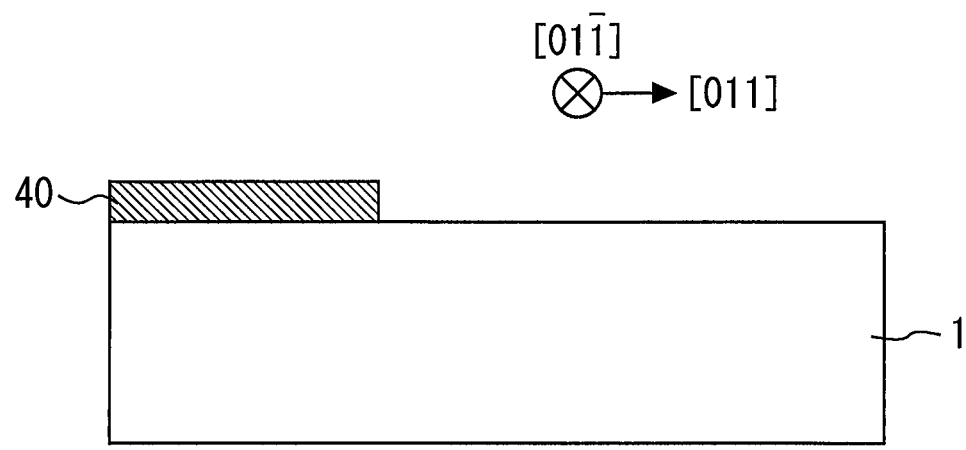
FIG. 3 illustrates a mask.

The manufacturing method of the above-described semiconductor laser device is described. First, a mask is formed on a semiconductor substrate. FIG. 3 illustrates a mask 40 formed on the semiconductor substrate 1. The mask 40 is formed on the main surface of the semiconductor substrate 1 such that its edge is in parallel with the [0 1 $\bar{1}$] direction. The material of the mask 40 is, for example, $SiO_2$.

Next, a semiconductor layer is selectively grown on a portion of the semiconductor substrate 1 not covered with the mask 40 and the resonator unit 10 having the front facet 12 defining a slope is formed. The selective growth is performed, for example, by an MOCVD scheme. As a result, it is possible to form the resonator unit 10 having the front facet 12 defining an inverted mesa slope.

Next, the upper electrode 20 is formed on the upper surface of the resonator unit 10 and the lower electrode 22 is formed on the lower surface of the semiconductor substrate 1, and then the anti-reflection coating film 12A is formed on the front facet 12 and the reflective film 14A is formed on the rear facet 14 of the resonator unit 10. In this manner, the semiconductor laser device of FIG. 1 is completed.

By the way, if the front facet serving as an emission facet and the rear facet serving as the reflecting mirror are formed by dry etching, unevenness of the facet is significantly increased when compared with the cleaved surface, which causes increase in the scattering loss of light. In view of this, in Embodiment 1 of the present invention, the front facet 12 is provided as a crystal surface formed by selective growth. The crystal surface formed by the selective growth is a very smooth surface. Accordingly, it is possible to suppress the scattering loss of light.

(Features)

The features of the semiconductor laser device and the manufacturing method of the semiconductor laser device according to Embodiment 1 of the present invention are described. As described with reference to FIG. 1, the length L1 of the resonator direction of the resonator unit 10 is shorter than the length L2 of the semiconductor substrate 1 in the resonator direction. As a result, the semiconductor laser device as a whole has the relatively long length L2, so that handling and cleavage of the semiconductor laser device are facilitated. The length L2 can be provided as a length equivalent to that of a conventional DFB-LD for low-speed modulation. Moreover, since the resonator unit 10 has the relatively short length L1, relaxation oscillation frequency is increased and it is suitable for high-speed modulation.

Also, the semiconductor laser device according to Embodiment 1, unlike the device of NPL 1, does not have a transparent waveguide. As a result, the number of times of crystal growth can be reduced and reduction in the manufacturing cost can be ensured. Further, in the manufacturing method of the semiconductor laser device according to Embodiment 1 of the present invention, since the front facet 12 is formed by selective growth, the front facet 12 is provided as a smooth crystal surface. Hence, the scattering loss of light can be suppressed relative to the device of NPL 2, etc. in which a dry-etched facet is provided as a reflecting mirror.

In a structure in which current injection is performed only on a part of the active layer, part of the current escapes to the outside of the effective resonator, so that the current that does not contribute to the laser oscillation increases and the power consumption increases. In contrast, in the semiconductor laser device according to Embodiment 1 of the present invention, current injection takes place for the entire active layer 4, so that it is possible to increase the proportion of the current contributing to laser oscillation when compared with the case of PTL 1 where current injection takes place for only part of the active layer.

By the way, PTL 2 discloses a structure where an facet of the inverted mesa slope is used as a reflecting mirror, and a laser beam is emitted in an upward direction which is a surface direction. In this structure, the light reflected by the inverted mesa slope passes the crystal-grown layer and the substrate, so that increase in the light loss and disturbance in the beam shape occur, and there is a possibility that the coupling efficiency with the optical fiber is lowered. In contrast, the semiconductor laser device according to Embodiment 1 of the present invention extracts light using the front facet 12 of the inverted mesa slope as an emission facet, and is free from the above-described harmful effects.

(Modification)

The semiconductor laser device according to Embodiment 1 of the present invention and the manufacturing method of the semiconductor laser device can be modified within the range where their features are not lost. For example, as long as the above-described effects can be obtained, the crystal surface or the orientation specified in the semiconductor laser device of Embodiment 1 can be modified.

The above-described modified example can also be applied to the semiconductor laser device and the manufacturing method of the semiconductor laser device according to the following embodiments. It should be noted that the semiconductor laser device and the manufacturing method of the semiconductor laser device according to the following embodiments abound in features that are similar to those of Embodiment 1, so that they are described with the focus laid upon features that are different from those in Embodiment 1.

Embodiment 2

Figure 4:
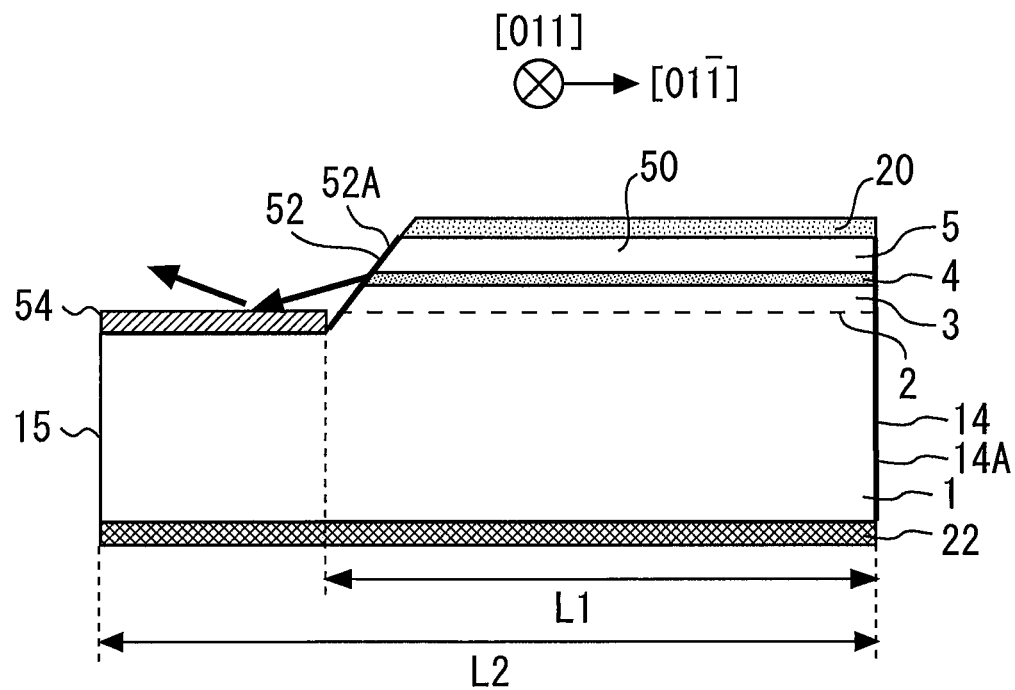
FIG. 4 is a cross-sectional view of a semiconductor laser device according to Embodiment 2.

FIG. 4 is a cross-sectional view of the semiconductor laser device according to Embodiment 2. On the semiconductor substrate 1, a resonator unit 50 is formed. The resonator unit 50 includes the first cladding layer 3, the diffraction grating 2 formed in the first cladding layer 3, the active layer 4 formed on the first cladding layer 3, the second cladding layer 5 formed on the active layer 4, a front facet 52 of a forward mesa slope, and the rear facet 14. Since the diffraction grating 2 should be formed on or underneath the active layer 4, it may be formed at a location other than the first cladding layer 3.

As described above, the front facet 52 defines a forward mesa slope. Forward mesa refers to mesa whose width is increased at its lower portion and reduced at its upper portion. Accordingly, a forward mesa slope is a slope whose lower portion protrudes more outwardly than the upper portion thereof. The front facet 52 according to Embodiment 2 is a (111) B surface. The front facet 12 is a surface having an inclination of 125.3° with respect to the (100) surface which is the main surface of the semiconductor substrate 1. To put it another way, the angle defined by the front facet 52 and the main surface of the semiconductor substrate 1 is 125.3°. The rear facet 14 is a surface parallel to the (0 1 $\bar{1}$) surface. The rear facet 14 is a cleaved surface formed by cleavage.

On the front facet 52, an anti-reflection coating film 52A is formed. The material of the anti-reflection coating film 52A is, for example, at least one of Si, $SiO_2$, $Al_2O_3$, $Ta_2O_5$, and SiN. The anti-reflection coating film 52A may be of a single layer or multiple layers. On the rear facet 14, the reflective film 14A is formed. By adjusting the film thickness of the anti-reflection coating film 52A and the reflective film 14A, a predetermined reflectance is realized. On the resonator unit 50, the upper electrode 20 is formed. Underneath the semiconductor substrate 1, the lower electrode 22 is formed. By applying voltage to the upper electrode 20 and the lower electrode 22, a current flows in the semiconductor laser device and the current is injected into the active layer 4 to obtain light emission from the active layer 4.

FIG. 4 illustrates the length L1 of the resonator unit 50 in a resonator direction. The resonator direction in this embodiment is the [0 1 $\bar{1}$] direction. Accordingly, the length of the resonator unit 50 in the resonator direction is a length from the front facet 52 to the rear facet 14. FIG. 4 also illustrates the length L2 of the semiconductor substrate 1 in the resonator direction. The length L1 of the resonator unit 50 in the resonator direction is defined to be shorter than the length of the semiconductor substrate 1 in the resonator direction. That is, L1<L2.

On a portion of the upper surface of the semiconductor substrate 1 where the resonator unit 50 is not formed, a metal mirror 54 is provided. The metal mirror 54 is formed by metal such as Au, Ge, Pt, or Ti and reflects light.

The semiconductor laser device according to Embodiment 2 is configured to emit a laser beam from the front facet 52. The arrow extending from the front facet 52 of FIG. 4 indicates an emission direction of the laser beam. Since the anti-reflection coating film 52A is formed on the front facet 52, the laser-oscillated light is emitted on an as-is basis from the front facet 52 to the outside. The angle defined by the front facet 52 and the main surface of the semiconductor substrate 1 is 125.3°, a refractive index of the semiconductor of the resonator unit 50 is in the order of 3.2, and a refractive index of outside air is in the order of 1, so that the laser beam is emitted obliquely downward from the front facet 52. The laser beam that has been emitted from the front facet 52 is reflected by the metal mirror 54 and travels in an obliquely upward straight line. By virtue of this, vignetting of light due to the semiconductor substrate 1 can be prevented.

(On the Manufacturing Method)

Figure 5:
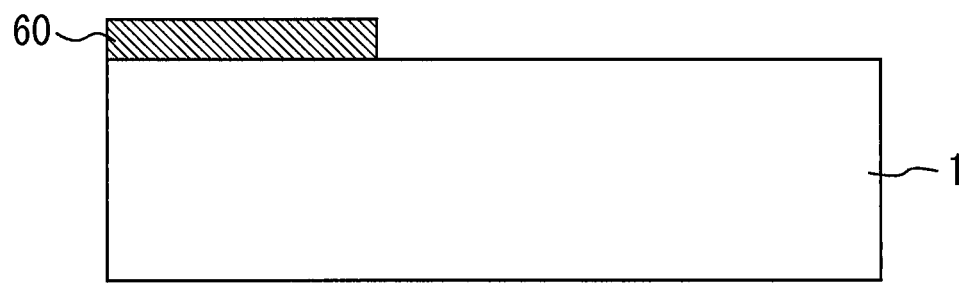
FIG. 5 illustrates a mask.

The semiconductor laser device according to Embodiment 2 is described. First, a mask is formed on a semiconductor substrate. FIG. 5 illustrates a mask 60 formed on the semiconductor substrate 1. The main surface of the semiconductor substrate 1 is a (100) surface. The mask 60 is formed on the main surface of the semiconductor substrate 1 such that its edge is in parallel with the [011] direction. The material of the mask 60 is, for example, $SiO_2$.

Next, a semiconductor layer is selectively grown on a portion of the main surface of the semiconductor substrate 1 not covered with the mask 60 and the resonator unit 50 having the front facet 52 defining a forward mesa slope is formed. The selective growth is performed, for example, by an MOCVD scheme.

Next, the upper electrode 20 is formed on the upper surface of the resonator unit 50 and the lower electrode 22 is formed on the lower surface of the semiconductor substrate 1, and then the anti-reflection coating film 52A is formed on the front facet 52 and the reflective film 14A is formed on the rear facet of the resonator unit 50. Also, the metal mirror 54 is formed between the front facet 52 and the chip front facet 15. In this manner, the semiconductor laser device of FIG. 4 is completed.

The front facet 52 is provided as a crystal surface formed by selective growth. The crystal surface formed by the selective growth is a very smooth surface. Accordingly, it is possible to suppress the scattering loss of light when compared with a case where the front facet is formed by etching.

(Features)

As described with reference to FIG. 4, the length L1 of the resonator direction of the resonator unit 50 is shorter than the length L2 of the semiconductor substrate 1 in the resonator direction. As a result, the semiconductor laser device as a whole has the relatively long length L2, so that handling and cleavage of the semiconductor laser device are facilitated. Moreover, since the resonator unit 50 has a relatively short length L1, relaxation oscillation frequency is increased and it is suitable for high-speed modulation. In addition, it is made possible to obtain the same effects as those of the semiconductor laser device and the manufacturing method of the semiconductor laser device of Embodiment 1.

Embodiment 3

Figure 6:
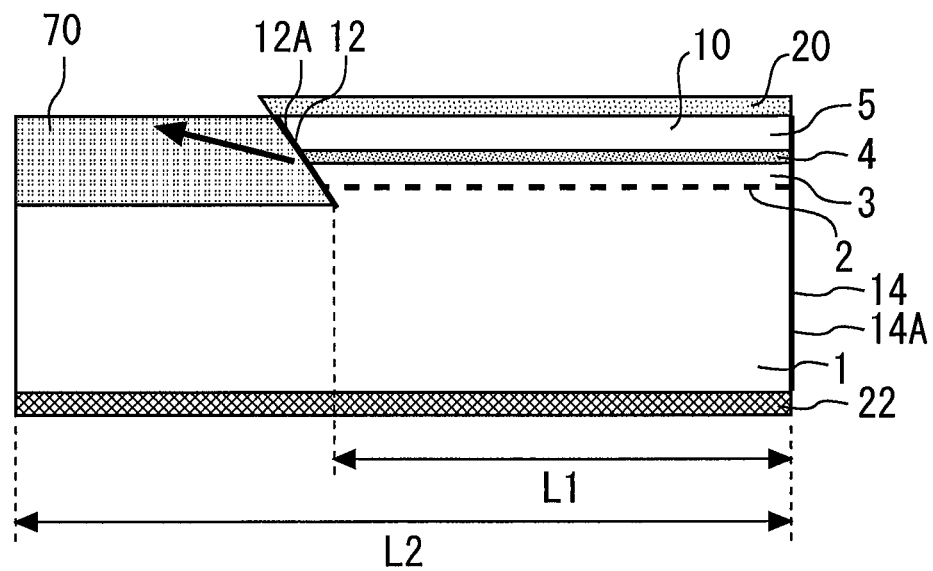
FIG. 6 is a cross-sectional view of a semiconductor laser device according to Embodiment 3.

FIG. 6 is a cross-sectional view of the semiconductor laser device according to Embodiment 3. On a portion of the upper surface of the semiconductor substrate 1 where the resonator unit 10 is not formed, a dielectric body 70 is provided. The dielectric body 70 fills the step between the portion of the upper surface of the semiconductor substrate 1 where the resonator unit 10 is not formed and the upper surface of the resonator unit 10. The material of the dielectric body 70 is, for example, polymer. It is preferable that the upper surface of the dielectric body 70 be flush with the upper surface of the resonator unit 10.

By filling the step between the main surface of the semiconductor substrate 1 and the upper surface of the resonator unit 10 with the dielectric material 70, a transfer process including resist application or resist pattern exposure can be facilitated. The transfer process is, for example, a process used in forming the upper electrode 20. In a case where the dielectric material 70 remains provided in a finished product, the dielectric material 70 is used as a waveguide. In other words, the laser beam that has been emitted from the front facet 12 propagates through the dielectric material 70. After the completion of the transfer process, the dielectric material 70 may be removed. It should be noted that the dielectric material may be provided on the semiconductor substrate of the semiconductor laser device having the front facet 52 of a forward mesa slope illustrated in FIG. 4. Such a dielectric material is provided on the metal mirror 54.

Embodiment 4

Figure 7:
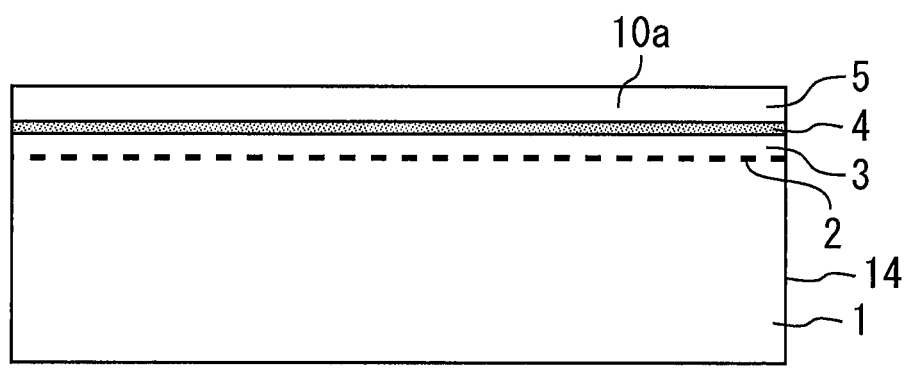
FIG. 7 illustrates a method for manufacturing a semiconductor laser device according to embodiment 4.
Figure 8:
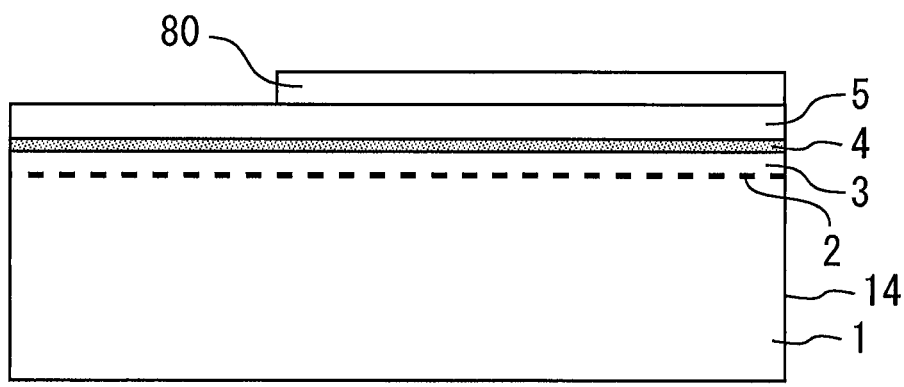
FIG. 8 illustrates a method for manufacturing a semiconductor laser device according to embodiment 4.

In Embodiment 4, the front facet of a forward mesa slope is formed by anisotropic etching. The manufacturing method of a semiconductor laser device according to Embodiment 4 is described. First, a semiconductor layer is grown on a semiconductor substrate to form a resonator unit. FIG. 7 illustrates a resonator unit 10a formed on the main surface of the semiconductor substrate 1. The main surface of the semiconductor substrate 1 is a (100) surface. The resonator unit 10a is formed on the entire surface of the main surface of the semiconductor substrate 1. Next, a mask is formed on a part of the resonator unit 10a. FIG. 8 illustrates the mask 80. The mask 80 is formed such that its edge is in parallel with the [0 1 1̄] direction. The material of the mask 80 is, for example, $SiO_2$.

Figure 9:
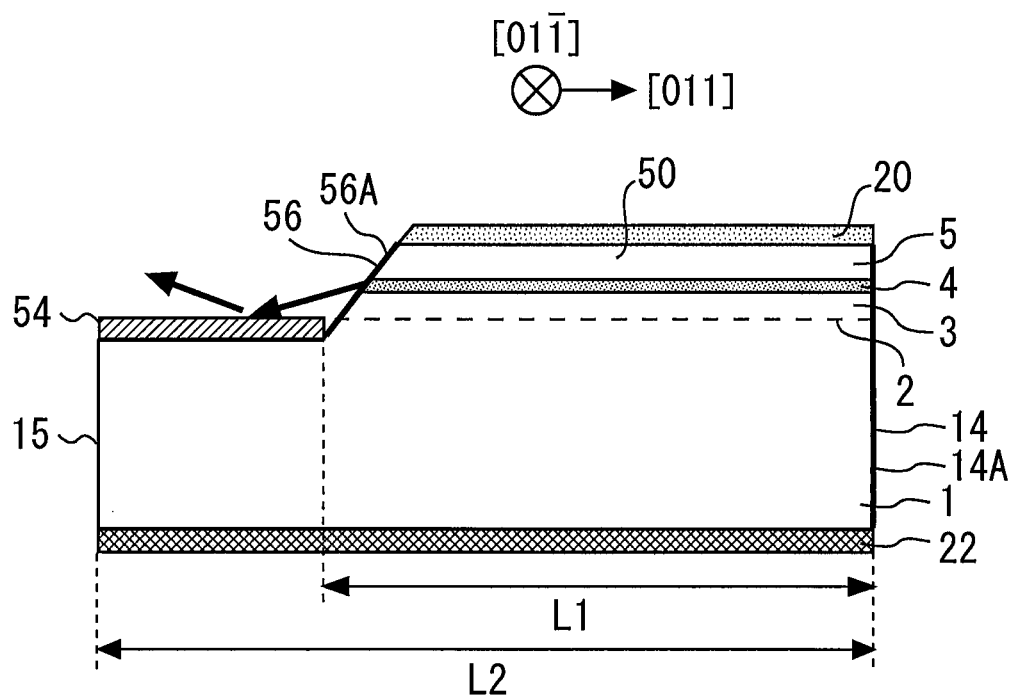
FIG. 9 is a cross-sectional view of a semiconductor laser device according to Embodiment 4.

Next, anisotropic etching by etchant is performed on the portion of the resonator unit 10a not covered with the mask 80. As the etchant, HBr, sulfuric acid, or tartaric acid, etc. is used to perform anisotropic etching on the resonator unit 10a and thereby the front facet 56 of the resonator unit 10 can be provided as a slope. In this case, the resonator unit 10 that has the front facet 56 of a forward mesa slope illustrated in FIG. 9 is formed.

Next, the upper electrode 20 is formed on the upper surface of the resonator unit 50 and the lower electrode 22 is formed on the lower surface of the semiconductor substrate 1, and then the anti-reflection coating film 56A is formed on the front facet 56 and the reflective film 14A is formed on the rear facet 14 of the resonator unit 50. In addition, the metal mirror 54 is formed. In this manner, a semiconductor laser device that has the front facet 56 consisting of the (111) A surface illustrated in FIG. 9 is completed. The length L1 of the resonator direction of the resonator unit 50 is shorter than the length L2 of the resonator direction of semiconductor substrate 1.

In Embodiment 4, since the front facet 56 is formed by anisotropic etching by etchant, a smooth front facet 56 can be obtained when compared with a case where the front facet is formed by dry etching. Hence, scattering loss of light can be suppressed.

Figure 10:
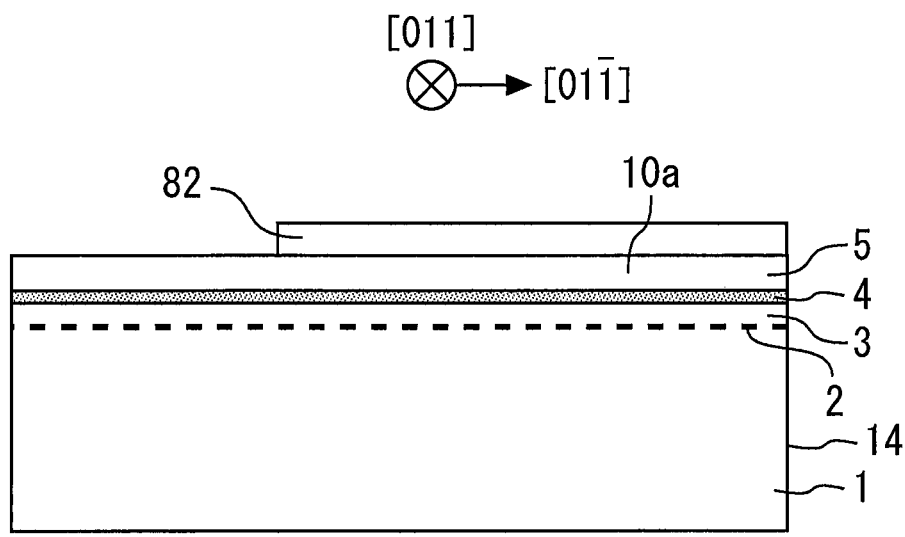
FIG. 10 illustrates a method for manufacturing a semiconductor laser device according to modification.
Figure 11:
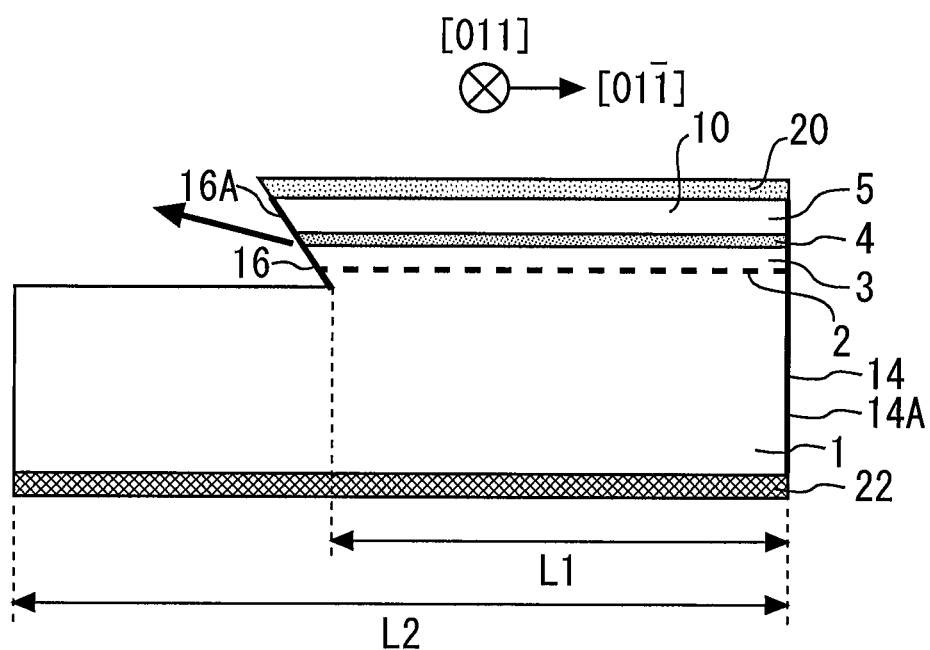
FIG. 11 is a cross-sectional view of a semiconductor laser device according to modification.

In Embodiment 4 of the present invention, the front facet of the forward mesa slope is formed by anisotropic etching but a front facet of an inverted mesa slope may be formed by anisotropic etching. The process of forming the front facet of an inverted mesa slope is described. First, as illustrated in FIG. 10, a mask 82 is formed on the resonator unit 10a such that its edge is in parallel with the [011] direction. Next, the mask 82 is made to be a mask, and the etchant such as HBr, sulfuric acid, or tartaric acid is used to perform anisotropic etching on the resonator unit 10a. When it has been done, the front facet of the resonator unit can be provided as a slope. In this case, the resonator unit 10 that has the front facet 16 of an inverted mesa slope illustrated in FIG. 11 is formed. The front facet 16 is a crystal surface consisting of a (111) A surface. Next, the upper electrode 20 is formed on the upper surface of the resonator unit 10 and the lower electrode 22 is formed on the lower surface of the semiconductor substrate 1, and then the anti-reflection coating film 16A is formed on the front facet 16 and the reflective film 14A is formed on the rear facet 14 of the resonator unit 10. In this manner, the semiconductor laser device illustrated in FIG. 11 is completed.

It should be noted that the technical features according to the above-described respective embodiments may be combined to enhance the effects of the present invention.

DESCRIPTION OF SYMBOLS 1 semiconductor substrate, 4 active layer, 10 resonator unit, 12 front facet, 12A anti-reflection coating film, 14 rear facet, 14A reflective film

The invention claimed is:

1. A semiconductor laser device comprising:
   a semiconductor substrate;
   a resonator unit formed on the semiconductor substrate and having an active layer, a diffraction grating formed on or underneath the active layer, a front facet of an inverted mesa slope, and a rear facet;
   an anti-reflection coating film formed on the front facet;
   a reflective film formed on the rear facet;
   an upper electrode formed on the resonator unit; and
   a lower electrode formed underneath the semiconductor substrate, wherein
   a length in a resonator direction of the resonator unit is shorter than a length in the resonator direction of the semiconductor substrate, the front facet is configured to emit a laser beam, and
a dielectric material formed on an opposite side of the front facet of the resonator unit from the resonator unit in the resonator direction in a portion of an upper surface of the semiconductor substrate where the resonator unit is not formed.

2. The semiconductor laser device according to claim 1, wherein
a main surface of the semiconductor substrate is a (100) surface,
the resonator unit is formed on the main surface,
the resonator direction is a [01 $\bar{1}$] direction,
the front facet is a (111) surface, and
the rear facet is a cleaved surface parallel to a (011) surface.

3. A semiconductor laser device comprising:
a semiconductor substrate;
a resonator unit formed on the semiconductor substrate and having an active layer, a diffraction grating formed on or underneath the active layer, a front facet of a forward mesa slope, and a rear facet, wherein a length in a resonator direction is shorter than a length in the resonator direction of the semiconductor substrate;
an anti-reflection coating film formed on the front facet;
a reflective film formed on the rear facet;
a metal mirror provided on the semiconductor substrate;
an upper electrode formed on the resonator unit;
a lower electrode formed underneath the semiconductor substrate, and
a dielectric material formed on an opposite side of the front facet of the resonator unit from the resonator unit in the resonator direction in a portion of an upper surface of the semiconductor substrate where the resonator unit is not formed,
wherein the metal mirror is configured to reflect a laser beam emitted from the front facet.

4. The semiconductor laser device according to claim 3, wherein
a main surface of the semiconductor substrate is a (100) surface,
the resonator unit is formed on the main surface,
the resonator direction is a [01 $\bar{1}$] direction,
the front facet is a (111) surface, and
the rear facet is a cleaved surface parallel to a (01 $\bar{1}$) surface.

5. The semiconductor laser device according to claim 1, wherein an upper surface of the dielectric material is flush with an upper surface of the resonator unit.

6. A manufacturing method of a semiconductor laser device comprising:
forming a mask on a semiconductor substrate;
selectively growing a semiconductor layer on a portion of the semiconductor substrate not covered with the mask and forming a resonator unit having a diffraction grating and a front facet defining a slope;
forming an upper electrode on an upper surface of the resonator unit and forming a lower electrode on a lower surface of the semiconductor substrate;
forming an anti-reflection coating film on the front facet and forming a reflective film on a rear facet of the resonator unit; and
forming a dielectric material on an opposite side of the front facet of the resonator unit from the resonator unit in the resonator direction in a portion of an upper surface of the semiconductor substrate where the resonator unit is not formed,
wherein
a length in a resonator direction of the resonator unit is shorter than a length in the resonator direction of the semiconductor substrate.

7. The manufacturing method of the semiconductor laser device according to claim 6, wherein
a main surface of the semiconductor substrate is a (100) surface,
the mask is formed such that an edge is formed on the main surface in parallel with a [01 $\bar{1}$] direction, and
the front facet defines an inverted mesa slope.

8. The manufacturing method of the semiconductor laser device according to claim 6, wherein
a main surface of the semiconductor substrate is a (100) surface,
the mask is formed such that an edge is formed on the main surface in parallel with a [011]direction, and
the front facet defines a forward mesa slope.

9. A manufacturing method of a semiconductor laser device comprising:
growing a semiconductor layer on a semiconductor substrate to form a resonator unit having a diffraction grating;
forming a mask on a part of the resonator unit;
performing anisotropic etching with etchant on a portion of the resonator unit not covered with the mask and shaping a front facet of the resonator unit into a slope;
forming an upper electrode on an upper surface of the resonator unit and forming a lower electrode on a lower surface of the semiconductor substrate;
forming an anti-reflection coating film on the front facet and forming a reflective film on a rear facet of the resonator unit, and
forming a dielectric material on an opposite side of the front facet of the resonator unit from the resonator unit in the resonator direction in a portion of an upper surface of the semiconductor substrate where the resonator unit is not formed, wherein
a length in a resonator direction of the resonator unit is shorter than a length in the resonator direction of the semiconductor substrate.

10. The manufacturing method of the semiconductor laser device according to claim 9, wherein
a main surface of the semiconductor substrate is a (100) surface,
the mask is formed such that an edge is formed in parallel with a [01 $\bar{1}$] direction, and the front facet defines a forward mesa slope.

11. The manufacturing method of the semiconductor laser device according to claim 9, wherein
a main surface of the semiconductor substrate is a (100) surface,
the mask is formed such that an edge is formed in parallel with a [011] direction, and
the front facet defines an inverted mesa slope.

* * * * *